(12) United States Patent
Byun et al.

(10) Patent No.: US 10,772,211 B2
(45) Date of Patent: Sep. 8, 2020

(54) CARTRIDGE NOZZLE ASSEMBLY AND APPARATUS FOR INJECTING INK

(71) Applicant: ENJET CO. LTD., Suwon-si (KR)

(72) Inventors: Do Young Byun, Seoul (KR); Vu Dat Nguyen, Suwon-si (KR)

(73) Assignee: ENJET CO. LTD., Suwon-si (KR)

( * ) Notice: Subject to any disclaimer, the term of this patent is extended or adjusted under 35 U.S.C. 154(b) by 0 days.

(21) Appl. No.: 16/269,570

(22) Filed: Feb. 7, 2019

(65) Prior Publication Data

US 2019/0240979 A1 Aug. 8, 2019

(30) Foreign Application Priority Data

Feb. 7, 2018 (KR) .................. 10-2018-0015223

(51) Int. Cl.
*B41J 2/14* (2006.01)
*B41J 2/175* (2006.01)
*B41J 3/28* (2006.01)
*H05K 3/12* (2006.01)

(52) U.S. Cl.
CPC .......... *H05K 3/125* (2013.01); *B41J 2/14314* (2013.01); *B41J 2/175* (2013.01); *B41J 2/1752* (2013.01); *B41J 2/17509* (2013.01); *B41J 2/17513* (2013.01); *B41J 2/17553* (2013.01); *B41J 3/28* (2013.01)

(58) Field of Classification Search
CPC ..... B41J 2/035; B41J 2/055; B41J 2/06; B41J 2002/061; B41J 2002/062; B41J 2002/063; B41J 2/14; B41J 2002/14475; B41J 2002/14491; B41J 2/175; H05K 3/1241

See application file for complete search history.

(56) References Cited

U.S. PATENT DOCUMENTS

| 2005/0212870 A1 | 9/2005 | Chiao et al. |
| 2012/0105528 A1* | 5/2012 | Alleyne ..................... B41J 2/06 347/14 |
| 2019/0329274 A1* | 10/2019 | Choi ....................... B05B 12/00 |

FOREIGN PATENT DOCUMENTS

| JP | 61-175447 | 11/1986 |
| KR | 10-2016-0031200 | 3/2016 |

* cited by examiner

*Primary Examiner* — Matthew Luu
*Assistant Examiner* — Kendrick X Liu

(57) ABSTRACT

Disclosed are a cartridge nozzle assembly and an apparatus for injecting ink including the cartridge nozzle assembly. In the ink injecting apparatus for forming a pattern by adhering the ink injected from a nozzle onto a substrate, the ink injecting apparatus includes a cartridge nozzle assembly, in a cartridge type, including a chamber sealingly accommodating the ink, and the nozzle for discharging the ink accommodated in the chamber; and a cartridge nozzle fixing member for replaceably fixing the cartridge nozzle assembly.

11 Claims, 5 Drawing Sheets

CARTRIDGE NOZZLE ASSEMBLY AND APPARATUS FOR INJECTING INK

RELATED APPLICATION

This application claims the benefit of priority of Korean Patent Application No. 10-2018-0015223 filed on Feb. 7, 2018, the contents of which are incorporated herein by reference in their entirety.

FIELD AND BACKGROUND OF THE INVENTION

The present invention relates to a cartridge nozzle assembly and an ink injecting apparatus including the same, and more particularly, to a cartridge nozzle assembly, in a cartridge type, which accommodates ink inside and includes a nozzle to discharge the ink, and an ink injecting apparatus which jets ink to form a pattern using the cartridge nozzle assembly which is easily replaceable.

In general, an ink injecting apparatus for injecting a fluid in forms of droplets has been typically employed to an inkjet printer. In recent years, however, an ink injecting apparatus are widely being used in the advanced industry including, a display manufacturing process, a printed circuit board manufacturing process, or a DNA chip manufacturing process.

The ink injecting apparatus discharges droplets from fluid-state ink and is largely divided into a thermal type apparatus and a piezoelectric type apparatus according to droplet discharge method. Recently, for ultrafine printing, an electrostatic jet printer based on an electrodynamic process is widely being used.

The electrostatic jet printer jets ink using an electrostatic force based on a potential difference generated by applying a voltage between a nozzle and a board. The electrostatic jet printer discharges droplets or continuous jets using a force of pulling a liquid surface by an electrostatic force. Thus, unlike another type of conventional jet printers, the electrostatic jet printer is known to have various advantages including capabilities of nano-scale patterning, highly viscous ink discharging, uniform droplet generation, and so on.

The conventional electrostatic jet printers perform printing while continuously supplying ink into a nozzle using a syringe pump. Here, in a case where the nozzle needs to be replaced for performing various line-width printing operations, a great deal of time was conventionally required for nozzle replacement, including various manual works for disconnecting and reconnecting various connecting portions, including connecting a syringe pump for supplying ink, connecting a high voltage for forming an electrical field, connecting a pneumatic supply for supplying pneumatic pressure into a nozzle, and so on, and a work of injecting ink into a new nozzle after reconnecting. In addition, deformation may occur to a nozzle position or a nozzle connecting portion during reconnecting, resulting in an unstable printing operation.

Operability and setting reliability are quite important factors in repeated printing operations. However, the conventional electrostatic jet printer has not seen significant improvements to the operability and setting reliability. Therefore, there has been a limitation in the conventional electrostatic jet printer to be employed in the industrial process for manufacturing displays or semiconductors.

SUMMARY OF THE INVENTION

The present invention has been made in an effort to solve the problems of the prior art, and it is an object of the present invention to provide a cartridge nozzle assembly, in a cartridge type, having noticeably improved operability and setting reliability by easily replacing a nozzle and an ink injecting apparatus including the cartridge nozzle assembly and performing a printing operation.

The object of the present invention is not limited to the above object and other objects not described above will be apparent to those skilled in the art from the following description.

The above and other objects of the present invention can be accomplished by providing an apparatus for injecting ink for forming a pattern by adhering the ink injected from a nozzle onto a substrate, the ink injecting apparatus comprising: a cartridge nozzle assembly, in a cartridge type, including: a chamber accommodating the ink so as to seal the ink in the chamber; and the nozzle for discharging the ink accommodated in the chamber; and a cartridge nozzle fixing member for replaceably fixing the cartridge nozzle assembly.

Here, the cartridge nozzle assembly may include a body including: the chamber forming a space for accommodating the ink in the chamber; and an ink supply path forming a path for supplying ink from an outside of the chamber into the chamber; and the nozzle including: a nozzle body which is in fluid communication with the chamber and which extends to have a constant tube diameter; and a nozzle tip formed to have a tube diameter tapering toward an end of the nozzle body and configured to discharge the ink.

The ink supply path may be formed as an ink supply tube inserted into and fixed to a hole communicating between an outer surface of the body and the chamber and formed in a tubular shape to penetrate the chamber and to be spaced apart from a tubular inner surface of the nozzle body.

The ink supply tube may be configured to extend to an end of the nozzle body, the nozzle tip being formed at the end of the nozzle body.

The nozzle tip may be configured to discharge the ink, using a force of an electric field generated by the application of a voltage to the ink supply tube.

The cartridge nozzle assembly may further comprise a cap engaged with the body to cover a top portion of the body having an end of the ink supply path and maintaining an inner pressure of the chamber at a constant pressure.

The body may further comprise a pneumatic supply path which forms a path through which pneumatic pressure is supplied from an outside of the chamber to an inside of the chamber.

Here, a stepped portion may be formed along a periphery of an outer side surface of the cartridge nozzle assembly, and the cartridge nozzle fixing member includes an insertion fixing part on which the stepped portion is mounted and into which the cartridge nozzle assembly is inserted to be fixed to the insertion fixing part.

Here, at least one screw hole may be formed at a side surface of the cartridge nozzle assembly, and the cartridge nozzle fixing member further includes a screw passing through a side surface of the insertion fixing part to be screw-engaged with the screw hole so as to fix the cartridge nozzle assembly.

The ink injecting apparatus may further comprise: a voltage supply connected to the screw and supplying a voltage; and an electrode formed in the cartridge nozzle assembly to discharge the ink from the nozzle tip using a force of an electric field generated by applying the voltage through the screw and the screw hole engaged with the screw.

Here, the cartridge nozzle fixing member may comprise an insertion fixing part allowing the cartridge nozzle assembly to be inserted into the insertion fixing part and fixed to the insertion fixing part, and a pneumatic supply port for supplying pneumatic pressure is formed at one side of the insertion fixing part, and wherein the pneumatic supply port and the pneumatic supply path are configured to be connected to each other when the cartridge nozzle assembly is inserted into the insertion fixing part and fixed to the insertion fixing part.

Here, an elastic rubber ring may be arranged at an end of the pneumatic supply port or at an end of the pneumatic supply path where the pneumatic supply port and the pneumatic supply path are connected to each other.

In addition, the above and other objects of the present invention can be accomplished by providing a cartridge nozzle assembly comprising a body including a chamber forming a space for accommodating ink in the chamber, an ink supply path forming a path for supplying ink from an outside of the chamber into the chamber, a pneumatic supply path forming a path of supplying pneumatic pressure from an outside into the chamber, and a voltage supply path for applying a voltage to an electrode formed in the cartridge nozzle assembly; a nozzle for discharging ink accommodated in the chamber; and a cap engaged with the body to cover a top portion of the body and maintaining an inside of the chamber at a constant pressure, an end of the ink supply path being formed at the top portion of the body.

As described above, in the cartridge nozzle assembly according to the present invention and the ink injecting apparatus including the same, a nozzle replacement time required for replacing nozzles and injecting ink into a new nozzle can be reduced to less than several minutes or less, unlike in the conventional case in which three or more hours were required for nozzle replacement.

In addition, a problem of unstable printing operation can be solved, the problem arising when a conventional nozzle is replaced, due to deformation occurring to a nozzle position or a nozzle connecting portion while manually disconnecting and reconnecting a syringe pump, a high voltage supply unit, a pneumatic supply unit, and so on.

DESCRIPTION OF SPECIFIC EMBODIMENTS OF THE INVENTION

Hereinafter, the present invention will be described in detail.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like numbers refer to like elements throughout.

Hereinafter, the present invention will be described in detail through example embodiments with reference to the accompanying drawings for explaining a cartridge nozzle assembly and an ink injecting apparatus including the same.

Figure 1:
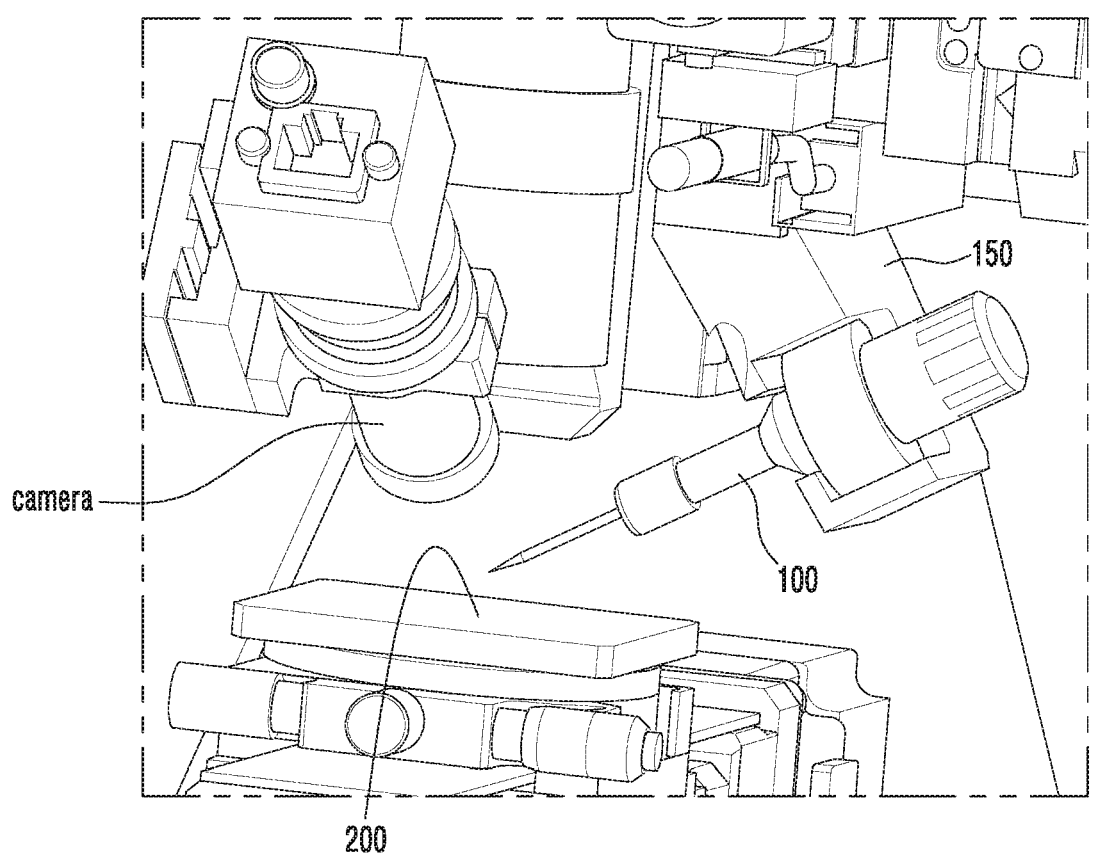
FIG. 1 is a perspective view illustrating essential parts of an ink injecting apparatus according to an embodiment of the present invention.
Figure 2:
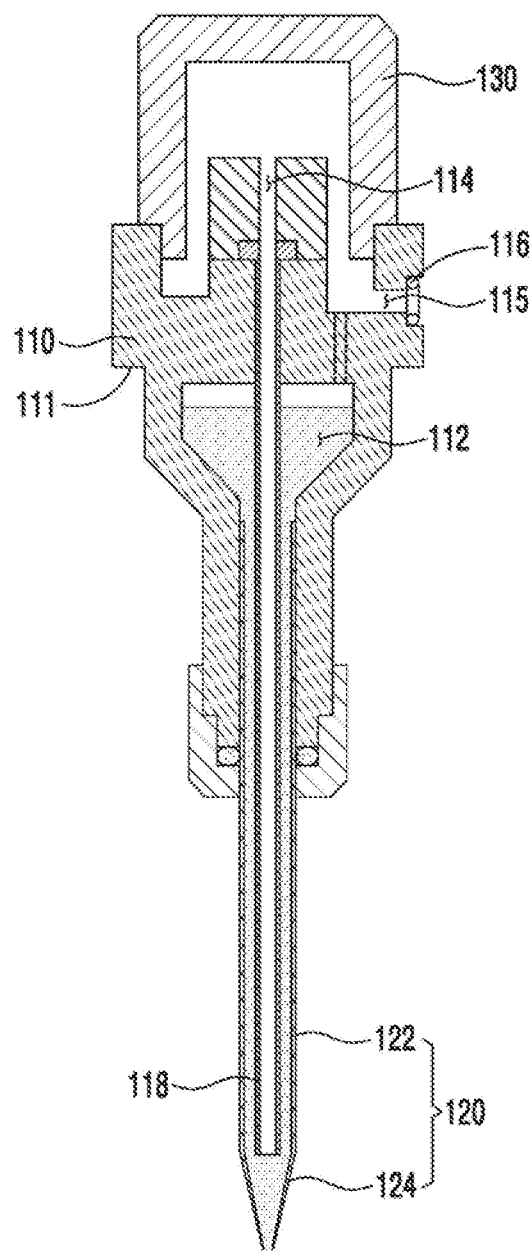
FIG. 2 is a cross-sectional view of a cartridge nozzle assembly according to an embodiment of the present invention.
Figure 3:
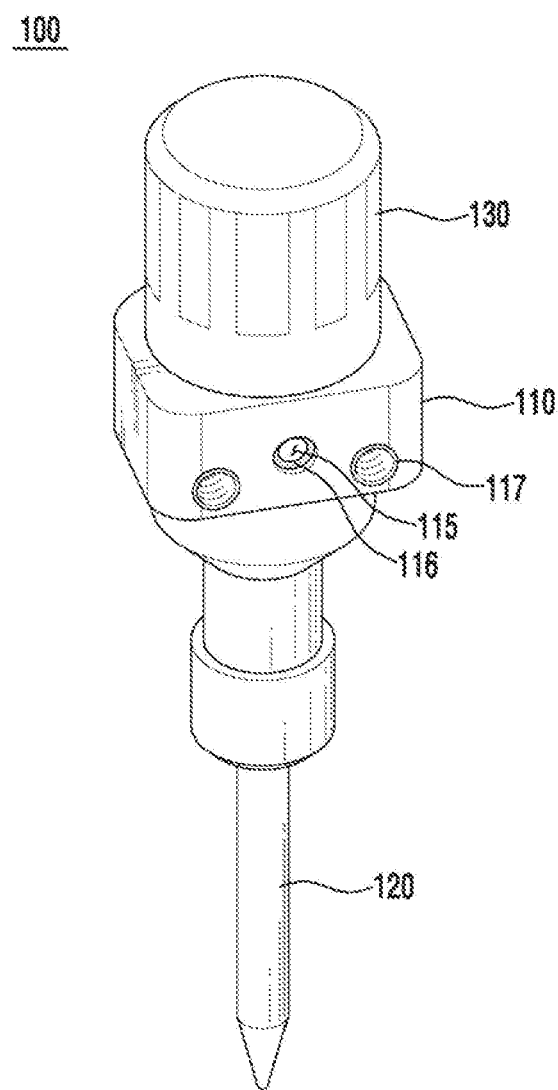
FIG. 3 is a perspective view illustrating rear side surfaces of FIG. 2.
Figure 4:
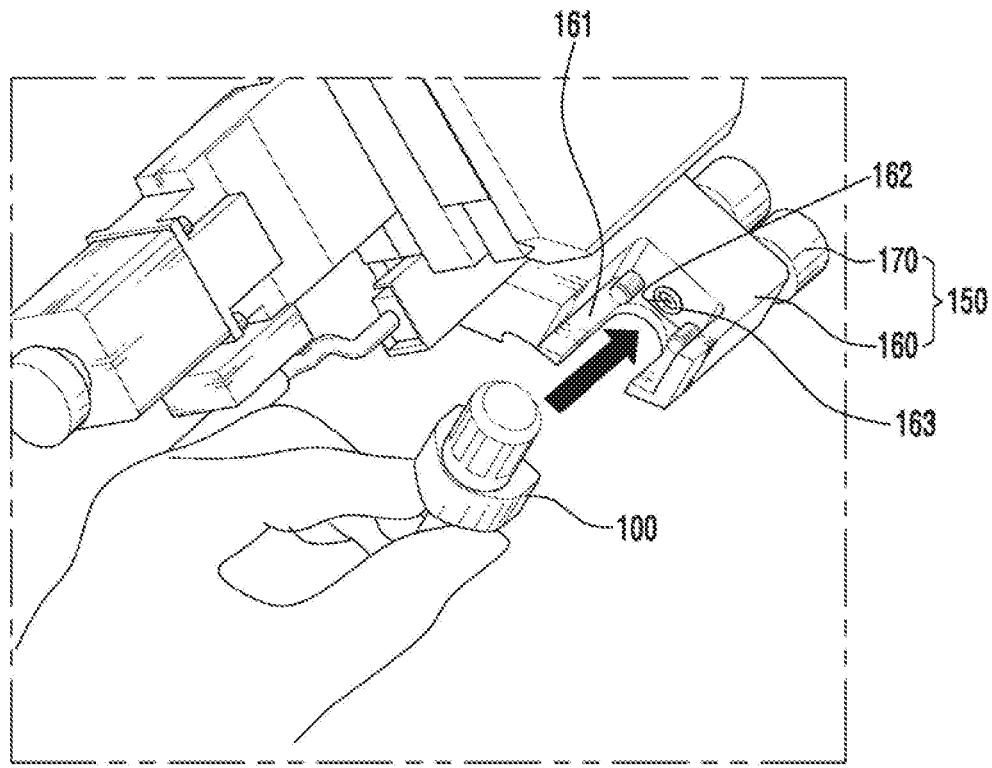
FIG. 4 is a perspective view illustrating a yet-to-be replaced cartridge nozzle assembly according to an embodiment of the present invention.
Figure 5:
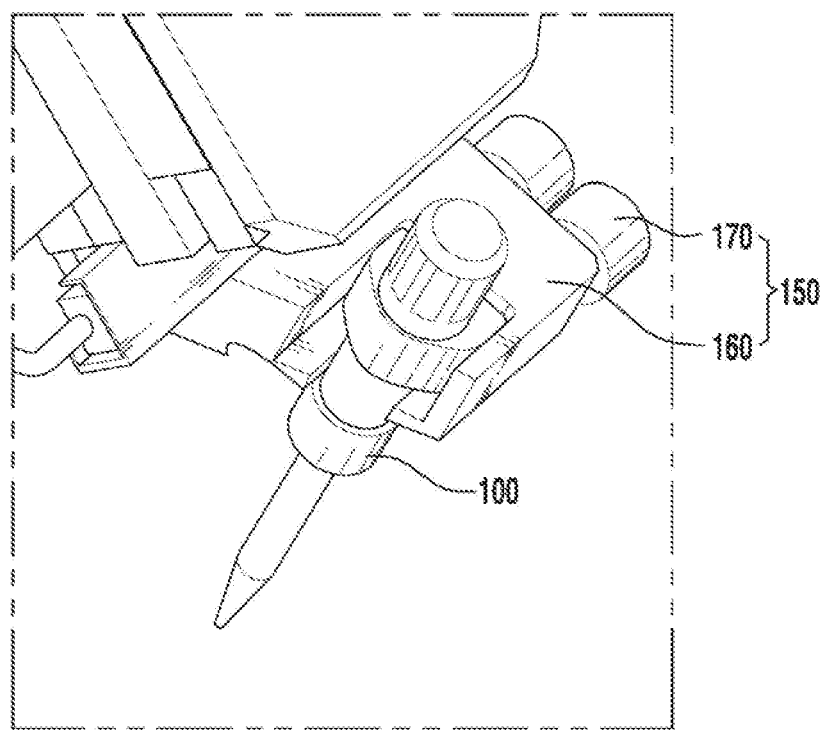
FIG. 5 is a perspective view illustrating the cartridge nozzle assembly before and after replacement.
Figure 6:
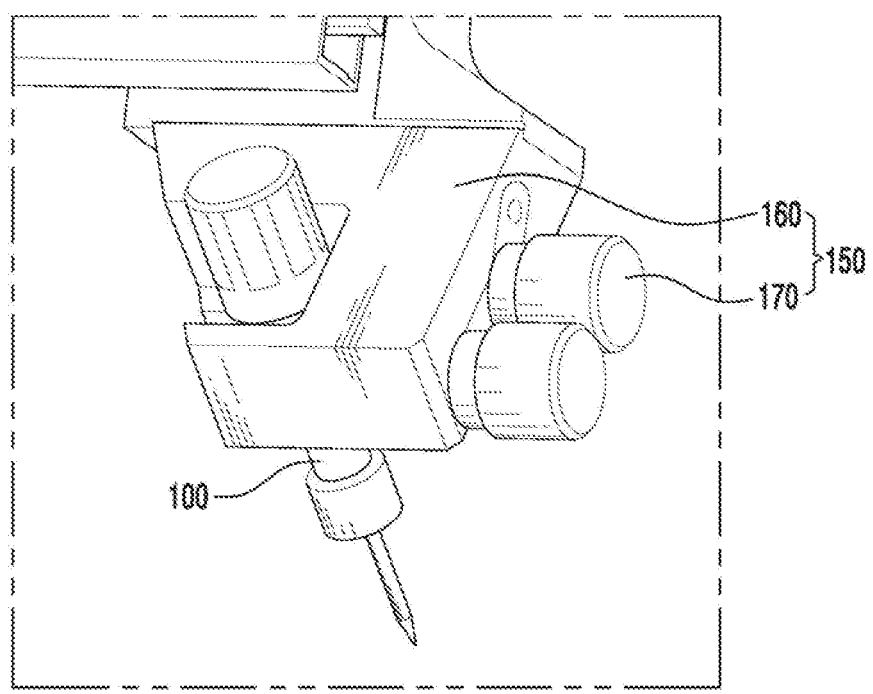
FIG. 6 is a perspective view illustrating that a cartridge nozzle assembly is mounted by a cartridge nozzle fixing member.

FIG. 1 is a perspective view illustrating essential parts of an ink injecting apparatus according to an embodiment of the present invention, FIG. 2 is a cross-sectional view of a cartridge nozzle assembly according to an embodiment of the present invention, FIG. 3 is a perspective view illustrating rear side surfaces of FIG. 2, FIG. 4 is a perspective view illustrating a yet-to-be replaced cartridge nozzle assembly according to an embodiment of the present invention, FIG. 5 is a perspective view illustrating the cartridge nozzle assembly before and after replacement, and FIG. 6 is a perspective view illustrating that a cartridge nozzle assembly is mounted by a cartridge nozzle fixing member.

The ink injecting apparatus according to the present invention forms a predetermined pattern by adhering ink injected from a nozzle 120 onto a printing target, such as a substrate (not shown) mounted on a stage 200. The present embodiment will be described with regard to an electrostatic ink jetting apparatus using an electro-hydro-dynamic jet by way of example, but aspects of the present invention are not limited thereto. The present invention can be applied to another type ink injecting apparatus.

The ink injecting apparatus according to an embodiment of the present invention may include a cartridge nozzle assembly 100 and a cartridge nozzle fixing member 150.

The cartridge nozzle assembly 100, in a cartridge type, includes a chamber 112 sealingly accommodating ink and the nozzle 120 for discharging the ink accommodated in the chamber 112. That is to say, unlike in the conventional device which continuously supplies ink to a nozzle using a syringe pump (not shown) to perform a printing operation, in the cartridge nozzle assembly 100 according to the present invention, printing is performed using the ink only accommodated in the chamber 112 of the cartridge nozzle assembly 100. In a case where the ink accommodated in the chamber 112 is used up or nozzle replacement is required during printing, the printing resumes after refilling ink in the cartridge nozzle assembly 100 or replacing the cartridge nozzle assembly 100.

Here, the ink used in the present invention (i.e., printing material) may encompass both organic materials and inorganic materials, including solid particles dispersed in a solvent, surfactants, polymers, and so on. An example of jetting a functional material will now be described.

Conductive or semiconducting nanostructures are dispersed in a solvent together with a polymer compound, followed by performing printing and performing thermocuring or photo-curing, thereby securing electrode properties. The nanostructures may include nanoparticles or one-dimensional nanostructures. The one-dimensional nanostructures are preferably of at least one type of nano wires, nano rods, nano pipes, nano belts or nano tubes. In addition, the conductive nanostructures are preferably nanostructures, carbon nano tubes or combinations thereof, which are selected from the group consisting of gold (Au), silver (Ag), aluminum (Al), nickel (Ni), zinc (Zn), copper (Cu), silicon (Si) and titanium (Ti).

The polymer compound may be at least one of a natural polymer compound and a synthetic polymer compound. The natural polymer compound is preferably at least one of chitosan, gelatin, collagen, elastin, hyaluronic acid, cellulose, silk fibroin, phospholipids and fibrinogen. The synthetic polymer compound is preferably at least one of poly(lactic-co-glycolic acid) (PLGA), poly(lactic acid) (PLA), poly(3-hydroxybutyrate-hydroxyvalerate (PHBV), polydioxanone (PDO), polyglycolic acid (PGA), poly(lactide-caprolactone) (PLCL), poly(ecaprolactone) (PCL), poly-L-lactic acid (PLLA), poly(ether urethane urea) (PEUU), cellulose acetate, polyethylene oxide (PEO), poly (ethylene vinyl alcohol (EVOH), polyvinyl alcohol (PVA), polyethyleneglycol (PEG) and polyvinylpyrrolidone (PVP).

A configuration of the cartridge nozzle assembly 100 will now be described in more detail. As illustrated in FIG. 2, the cartridge nozzle assembly 100 may include a body 110, the nozzle 120, and a cap 130.

The body 110 has a predetermined shape and defines a body of the cartridge nozzle assembly 100. The chamber 112, which is a space for accommodating ink, is formed in the body 110.

In addition, an ink supply path, which is a path for injecting ink into the chamber 112 from a top portion of the body 110, may be formed to inject ink into the chamber 112 using a syringe pump. Here, the ink supply path may be formed as an ink supply tube 118 inserted into a hole 114 passing through between the outer surface of the body 110 and the chamber 112 and elongated in a lengthwise direction. The ink supply tube 118 is preferably formed to pass through the chamber 112 and to be elongated to an end of a nozzle body 122, a nozzle tip 124 of the nozzle 120 being formed at the end of the nozzle body, which will later be described. As illustrated herein, the ink supply tube 118 is formed to be spaced apart from a tubular inner surface of the nozzle body 122 by a predetermined distance.

Therefore, the ink injected into the hole 114 through the syringe pump may be supplied to the nozzle tip 124 via the ink supply tube 118. As illustrated, since the nozzle tip 124 has a tube tapering toward its end, a capillary force may increase downwardly due to the shape of the nozzle tip 124, thereby densely filling the ink in the nozzle tip 124 without generating a bubble trap. The ink which filled the nozzle tip 124 may rise through the space between the ink supply tube 118 and the tubular inner surface of the nozzle body 122, thereby filling the chamber 112. Therefore, according to the present invention, it is possible to completely fill ink into a tip part of the capillary-type nozzle 120 without generating a bubble trap and then to inject ink into the cartridge nozzle assembly 100.

In addition, a pneumatic supply path 115 for forming a path for supplying pneumatic pressure from the outside of the chamber 112 to the inside of the chamber 112 is formed in the body 110. In the present invention, when the cartridge nozzle assembly 100 is mounted on and fixed to the cartridge nozzle fixing member 150, a pneumatic supply port 162 for supplying pneumatic pressure into the cartridge nozzle assembly 100 is connected to a pneumatic supply path 115 to supply the pneumatic pressure into the chamber 112. Here, the pneumatic pressure supplied into the chamber 112 pushes the ink accommodated in the chamber 112 to discharge the ink through the nozzle tip 124.

As illustrated in FIG. 3, at least one screw hole 117 is formed on a rear side surface of the body 110, and a screw 170 to be described later is screw-engaged with the screw hole 117, thereby tightly fixing the cartridge nozzle assembly 100 to a fixed position. In addition, as will later be described, the screw hole 117 may perform an intermediary function with the screw 170 to apply a voltage to the cartridge nozzle assembly 100. Therefore, in order to perform a voltage supplying function, the screw hole 117 is preferably made of a metallic material, which will later be described.

The nozzle 120 may include a nozzle body 122 and a nozzle tip 124. As described above, the nozzle body 122 may be in fluid communication with the chamber 112 and may be linearly formed so as to have a constant tube diameter, and the nozzle tip 124 may be formed to have a tube diameter tapering toward an end of the nozzle body 122. A fine nozzle hole is formed at the end of the nozzle tip 124 to allow the ink to be injected toward the substrate. The size of the fine nozzle hole may be determined according to the size of a pattern to be formed. The fine nozzle hole may have a size of 1 µm or less, 10 µm or less, 20 µm or less, or 50 µm or less.

Here, the nozzle 120 may be integrally formed with the body 110. However, as illustrated, the nozzle 120 is preferably detachably engaged with the body 110 so as to allow the nozzle 120 to be replaced with a new nozzle having a different length of the nozzle 120 and a different diameter of the nozzle hole.

As illustrated in FIG. 2, the cap 130 is engaged with the body 110 so as to cover the top portion of the body 110, thereby covering the cartridge nozzle assembly 100 so as to prevent the ink from flowing out of the cartridge nozzle assembly 100 through the ink supply path installed at the top portion of the body 110. Therefore, after the cap 130 is disengaged from the body 110, the ink can be injected into the chamber 112 using the syringe pump through the ink supply path of the body 110. Then, when the ink injection into the chamber 112 is completed, the cap 130 is engaged with the top portion of the body 110, thereby sealing the body 110. In addition, when the cap 130 is engaged with the body 110, the inside of the chamber 112 is maintained with a constant pressure to prevent the ink from flowing reversely through the ink supply path.

The cartridge nozzle fixing member 150 may replaceably fix the cartridge nozzle assembly 100 to the ink injecting apparatus and may include an insertion fixing part 160 and a screw 170.

The insertion fixing part 160 is a member into which the cartridge nozzle assembly 100 is inserted so as to be fixed at a fixed position. Here, the insertion fixing part 160 may have one side surface opened, and a mounting unit 161 may be formed at the bottom to allow the cartridge nozzle assembly 100 to be inserted and mounted on the mounting unit 161. A stepped portion 111 having steps may be formed to correspond to the mounting unit 161 along the periphery of the outer surface of the cartridge nozzle assembly 100 (specifically, the body 110). Therefore, the cartridge nozzle assembly 100 is inserted through the opened one side surface of the insertion fixing part 160, and the stepped portion 111 is mounted on the mounting unit 161, thereby fixing the cartridge nozzle assembly 100 onto the insertion fixing part 160.

In addition, at least one screw 170 passing through the insertion fixing part 160 is screw-engaged with the screw hole 117 described above with reference to FIG. 3, thereby more tightly fixing the cartridge nozzle assembly 100 to the fixing position.

Here, a voltage supply for supplying and controlling a voltage through the screw 170 may be connected to the screw 170. Therefore, the voltage supply may apply a high voltage to the electrode formed in the cartridge nozzle assembly 100 through the screw 170 and the screw hole 117 and may control the applied voltage. The ink supply tube 118 may be formed using a metal and may be electrically connected to the screw hole 117 to be used as an electrode.

If the high voltage is applied to the ink supply tube 118 which is the electrode through the voltage supply, an electric field is generated between the electrode and the substrate. Here, the electrode and the substrate may have opposite polarities, or the substrate may be grounded. The high voltage applied to the electrode generates the electric field in a direction from the electrode to the substrate, and the ink may be finely and minutely discharged using an electrostatic force based on the electric field.

In addition, a pneumatic supply port for supplying pneumatic pressure may be formed on one side surface of the insertion fixing part 160. Therefore, if the cartridge nozzle assembly 100 is mounted on and fixed to the insertion fixing part 160, an end of the pneumatic supply path formed in the body 110 is connected to the pneumatic supply port and then the pneumatic pressure is applied to the chamber 112 of the cartridge nozzle assembly 100. Here, in the present invention, the pneumatic supply port 162 and the pneumatic supply path 115 are connected to each other simply by inserting the cartridge nozzle assembly 100 into the cartridge nozzle fixing member 150 so as to be fixed. Therefore, a separate manual work for pneumatic connection is not required.

Here, when the pneumatic supply port 162 is connected to the pneumatic supply path 115, an elastic rubber ring 116 or 163 is formed at an end of the pneumatic supply port 162 or at an end of the pneumatic supply path 115 such the elastic rubber ring is compressed when the cartridge nozzle assembly 100 is fixedly mounted, thereby preventing air from leaking through a connected portion of the pneumatic supply port and the pneumatic supply path.

Hereinafter, a process of replacing the cartridge nozzle assembly 100 according to the present invention will be described with reference to FIGS. 4 to 6.

The cap 130 of the cartridge nozzle assembly 100 is disassembled, the chamber 112 is refilled with ink using a syringe pump, and the cap 130 is assembled again, thereby preparing the cartridge nozzle assembly 100 refilled with ink. Here, as described above, since the nozzle 120 also can be disengaged from the body 110, the nozzle can be replaced with another nozzle 120 suitable for printing.

The cartridge nozzle assembly 100 can be fixed by being inserted such that the stepped portion 111 of the body 110 is mounted on the mounting unit 161 of the insertion fixing part 160 through the open side surface of the insertion fixing part 160. Therefore, the cartridge nozzle assembly can be inserted to be fixed in such a manner the body 110 is located in the insertion fixing part 160 as a whole and the nozzle 120 protrudes outwardly through a bottom portion of the insertion fixing part 160.

Here, the screw 170 is engaged with the screw hole 117 formed in the cartridge nozzle assembly 100 by rotating the screw 170, thereby more tightly fixing the cartridge nozzle assembly 100 to a fixed position.

Further, in the present invention, since a voltage supply (not shown) connected to the screw 170 applies a voltage for generating static electricity to the electrode formed within the cartridge nozzle assembly 100 through the screw 170 and the screw hole 117, it is not necessary to separately perform a connecting work for applying the voltage when the cartridge nozzle assembly 100 is replaced.

In addition, in the present invention, since the pneumatic supply port 162 formed in the cartridge nozzle fixing member 150 is connected to the pneumatic supply path 115 formed in the cartridge nozzle assembly 100 simply by fixing the cartridge nozzle assembly 100 to the cartridge nozzle fixing member 150, it is not necessary to separately perform a coupling work for supplying pneumatic pressure when the cartridge nozzle assembly 100 is replaced.

Although an exemplary embodiment of the present disclosure has been shown and described with reference to accompanying drawings, it would be appreciated by those skilled in the art that the invention can be embodied in other specific forms without changing technical principles and spirit or essential features of the present disclosure. Therefore, it should be interpreted that meaning and scope of the claims and all changes or modifications derived from equivalent concepts of the present invention are considered within the scope of the disclosure.

EXPLANATION OF IMPORTANT REFERENCE NUMERALS

| | |
|---|---|
| 100: Cartridge nozzle assembly | 110: Body |
| 111: Stepped portion | 112: Chamber |
| 114: Hole | 115: Pneumatic supply path |
| 116: Rubber ring | 117: Screw hole |
| 118: Ink supply tube | 120: Nozzle |
| 122: Nozzle body | 124: Nozzle tip |
| 130: Cap | 150: Cartridge nozzle fixing member |
| 160: Insertion fixing part | 161: Mounting unit |
| 162: Pneumatic supply port | 163: Rubber ring |
| 170: Screw | 200: Stage |

What is claimed is:

1. An apparatus for injecting ink to form a pattern by adhering the ink injected from a nozzle onto a substrate, the apparatus comprising:
   a cartridge nozzle assembly, in a cartridge type, including:
      a chamber accommodating the ink so as to seal the ink in the chamber; and
      the nozzle for discharging the ink accommodated in the chamber; and
   a cartridge nozzle fixing member for replaceably fixing the cartridge nozzle assembly; wherein the cartridge nozzle assembly comprises:
   a body including: the chamber forming a space for accommodating the ink in the chamber; and an ink supply path forming a path for supplying ink from an outside of the chamber into the chamber; and
   the nozzle including: a nozzle body which is in fluid communication with the chamber and which extends to have a constant tube diameter; and a nozzle tip formed to have a tube diameter tapering toward an end of the nozzle body and configured to discharge the ink;
   wherein the ink supply path is formed as an ink supply tube inserted into and fixed to a hole communicating between an outer surface of the body and the chamber and formed in a tubular shape to penetrate the chamber and to be spaced apart from a tubular inner surface of the nozzle body.

2. The apparatus of claim 1, wherein the ink supply tube is configured to extend to an end of the nozzle body, the nozzle tip being formed at the end of the nozzle body.

3. The apparatus of claim 1, wherein the nozzle tip is configured to discharge the ink, using a force of an electric field generated by the application of a voltage to the ink supply tube.

4. The apparatus of claim 1, wherein the cartridge nozzle assembly further comprises a cap engaged with the body to cover a top portion of the body having an end of the ink supply path and maintaining an inner pressure of the chamber at a constant pressure.

5. The apparatus of claim 1, wherein the body further comprises a pneumatic supply path which forms a path through which pneumatic pressure is supplied from an outside of the chamber to an inside of the chamber.

6. The apparatus of claim 1, wherein a stepped portion is formed along a periphery of an outer side surface of the cartridge nozzle assembly, and the cartridge nozzle fixing member includes an insertion fixing part on which the stepped portion is mounted and into which the cartridge nozzle assembly is inserted to be fixed to the insertion fixing part.

7. An apparatus for injecting ink to form a pattern by adhering the ink injected from a nozzle onto a substrate, the apparatus comprising:
a cartridge nozzle assembly, in a cartridge type, including:
a chamber accommodating the ink so as to seal the ink in the chamber; and
the nozzle for discharging the ink accommodated in the chamber; and
a cartridge nozzle fixing member for replaceably fixing the cartridge nozzle assembly;
wherein a stepped portion is formed along a periphery of an outer side surface of the cartridge nozzle assembly, and the cartridge nozzle fixing member includes an insertion fixing part on which the stepped portion is mounted and into which the cartridge nozzle assembly is inserted to be fixed to the insertion fixing part;
wherein the body further comprises a pneumatic supply path which forms a path through which pneumatic pressure is supplied from an outside of the chamber to an inside of the chamber;
wherein at least one screw hole is formed at a side surface of the cartridge nozzle assembly, and the cartridge nozzle fixing member further includes a screw passing through a side surface of the insertion fixing part to be screw-engaged with the screw hole so as to fix the cartridge nozzle assembly.

8. The apparatus of claim 7, wherein the cartridge nozzle assembly comprises:
a body including: the chamber forming a space for accommodating the ink in the chamber; and an ink supply path forming a path for supplying ink from an outside of the chamber into the chamber; and
the nozzle including: a nozzle body which is in fluid communication with the chamber and which extends to have a constant tube diameter; and a nozzle tip formed to have a tube diameter tapering toward an end of the nozzle body and configured to discharge the ink.

9. The apparatus of claim 7, further comprising:
a voltage supply connected to the screw and supplying a voltage; and an electrode formed in the cartridge nozzle assembly to discharge the ink from a nozzle tip of the nozzle using a force of an electric field generated by applying the voltage through the screw and the screw hole engaged with the screw.

10. An apparatus for injecting ink to form a pattern by adhering the ink injected from a nozzle onto a substrate, the apparatus comprising:
a cartridge nozzle assembly, in a cartridge type, including:
a chamber accommodating the ink so as to seal the ink in the chamber; and
the nozzle for discharging the ink accommodated in the chamber; and
a cartridge nozzle fixing member for replaceably fixing the cartridge nozzle assembly;
wherein a stepped portion is formed along a periphery of an outer side surface of the cartridge nozzle assembly, and the cartridge nozzle fixing member includes an insertion fixing part on which the stepped portion is mounted and into which the cartridge nozzle assembly is inserted to be fixed to the insertion fixing part;
wherein the cartridge nozzle assembly comprises:
a body including: the chamber forming a space for accommodating the ink in the chamber; and an ink supply path forming a path for supplying ink from an outside of the chamber into the chamber; and
the nozzle including: a nozzle body which is in fluid communication with the chamber and which extends to have a constant tube diameter; and a nozzle tip formed to have a tube diameter tapering toward an end of the nozzle body and configured to discharge the ink
wherein the cartridge nozzle fixing member comprises an insertion fixing part allowing the cartridge nozzle assembly to be inserted into the insertion fixing part and fixed to the insertion fixing part, and a pneumatic supply port for supplying pneumatic pressure is formed at one side of the insertion fixing part, and wherein the pneumatic supply port and the pneumatic supply path are configured to be connected to each other when the cartridge nozzle assembly is inserted into the insertion fixing part and fixed to the insertion fixing part.

11. The apparatus of claim 10, wherein an elastic rubber ring is arranged at an end of the pneumatic supply port or at an end of the pneumatic supply path where the pneumatic supply port and the pneumatic supply path are connected to each other.

\* \* \* \* \*